United States Patent [19]
Gundersen

[11] Patent Number: 4,890,040
[45] Date of Patent: Dec. 26, 1989

[54] OPTICALLY TRIGGERED BACK-LIGHTED THYRATRON NETWORK

[76] Inventor: Martin A. Gundersen, 6828 N. La Presa Ave., San Gabriel, Calif. 91775

[21] Appl. No.: 56,587

[22] Filed: Jun. 1, 1987

[51] Int. Cl.$^4$ ............................................. H05B 41/36
[52] U.S. Cl. ...................................... 315/155; 315/156
[58] Field of Search ............................. 372/38, 68, 70; 315/362, 147, 151, 154, 155, 156, 157, 158, 159

[56] References Cited

U.S. PATENT DOCUMENTS

3,478,278  11/1969  Muncheryan ........................ 372/68

Primary Examiner—Robert L. Griffin
Assistant Examiner—T. Salindong
Attorney, Agent, or Firm—Clifton L. Anderson

[57] ABSTRACT

A high-power switch network includes a laser fiber optically coupled to a network including light-initiated glow discharge switches in a Marx configuration. A low pressure gas source is used to replenish gas within the switches lost due to ionization. Each switch has a cylindrical insulating envelope with conductive end caps at each end. The end caps are electrically coupled, respectively, to a cup-shaped anode and a cup-shaped cathode. Apertures are formed centrally in closely spaced plates of the respective cup-shaped electrodes. Optical fiber cables extend through vacuum sealed ports of the switches so that the unfocused laser light is directed about the aperture of the cathode so as to close the switch, thus providing a high power output from the network.

13 Claims, 5 Drawing Sheets

PRIOR ART

OPTICALLY TRIGGERED BACK-LIGHTED THYRATRON NETWORK

BACKGROUND OF THE INVENTION

The present invention relates to pulse modulators for high power applications, and, in particular, to a modulator comprising a network of high powered switches.

Particle accelerators, fusion related devices, excimer and free electron lasers, gyrotrons, magnetrons, and relativistic versions of these devices can require rapid successions of high power pulses above 20 kilovolts (kV). Typically, 100 kV to 1 megavolt (MV) pulses are needed, and some designs require in excess of 1 MV. Switches designed to generate such pulses typically handle one to hundreds of kiloamperes.

The modulators that are used for these applications suffer from severe limitations in repetition rate, difficulty in triggering in a satisfactory way, degradation of the switches in the modulator, and standoff voltage capability. Most limitations relate to the performance capabilities of the switch.

Among the modulators used are those based on spark gap switches. Spark gap switches require significant gas flow for operation at any repetition rate. In addition, the electrodes of the spark gaps degrade rapidly when large amounts of energy are switched. The forward drop in a spark gap is also large, resulting in large electrical energy dissipation when the spark gap is in operation. Further, the spark gap requires electrical triggering, so that care must be taken to devise triggering methods that will not be damaged by the high voltage operation of the modulator.

A commercial thyratron, such as the EG&G HY 5, HY 7, or 3202, is sometimes considered for these applications. The thyratron is ordinarily not used because it requires excessive isolation of its cathode heater and gas reservoir electrical connections, which usually operate at power levels that depend on the size of the thyratron. In addition, the thyratrons that are commercially available are ordinarily not capable of switching the currents required, and are also limited in terms of repetition rate and total energy switched.

When an incorporating system requires greater power output than can be provided by the selected switch type, it is desirable to network switches so they collectively provide the desired output. Series networks can provide greater voltage pulses and parallel networks can be used for greater current. Marx networks are known for providing a voltage output which is much greater than the voltage provided by the charging power supply.

When high power switches are used in a network to provide greater power output, two concerns must be addressed. The first concern is the triggering method and its ability to provide the proper timing for each switch. The second concern is the electrical isolation of the switches, the trigger components and network components. Improper isolation of components impedes the storage of energy required for the desired pulse output.

Electrical triggering methods are most common. Electrical triggering can be effected when sufficient energy is applied across a spark-gap type switch, but it is difficult to control the timing of the trigger to the extent required for some application. Other switch networks employ separate trigger circuits, but these have problems with electrical isolation and controlling relative timing of trigger signals sent to different switches in the network.

Optical triggering of spark gap type switches has been effected. For example, the output of a ruby laser can be directed to a spark gap switch. If the laser beam is focused properly on the cathode, arcing can be induced. However, the above-mentioned disadvantages of spark gap switches cannot be expected to disappear when operated in groups.

What is needed is a high power switch network which can provide for precise relative trigger timing of switches, good electrical isolation of components, which minimize the problem of electrode deterioration and gas handling.

SUMMARY OF THE INVENTION

The present invention is a high power switch network comprising electrically coupled light-initiated glow discharge switches, means for supplying and storing energy in the network, a light source, and optical coupling between the light source and the switches. Preferably, the optical coupling is effected with optical fibers. The light source can be a laser or flashlamp. A low pressure gas source can be replenish gas pressure lost with repeated triggering of the switches.

This invention relates to a high power pulse generator or modulator, capable of operating at improved repetition rates, with lower energy dissipation, greater reliability, less energy for triggering, improved simplicity in triggering, less energy and greater simplicity in handling gases, and much improved electrical isolation.

The modulator or pulse generator is comprised of a number of switches, ranging from one to possibly 30 or more, along with energy storage and circuit elements comprised of inductors and capacitors. In the simplest configuration, the modulator has switches that are connected in series.

The innovative feature of this approach is that the switches can be operated without requiring special electrical isolation. This configuration is possible, because the light triggering mechanism allows each switch to be at a different voltage. Each switch can have about 30 kV across it and yet may be floating at a voltage that is several hundred kV. This is ordinarily very difficult to achieve.

In addition, the features that are described for the light initiated high power switch also work to the advantage of an incorporating switch network. Thus the switch network operates at high current and high repetition rate without serious switch degradations. Thus, the switch network is comprised of switches without special additional isolation. This significantly simplifies the switch network, and even makes possible several configurations that are needed for particle accelerators, fusion and laser applications. Other features and advantages of the present invention are apparent in the description below with reference to the following drawings.

DESCRIPTION OF THE PREFERRED EMBODIMENTS

Figure 1:
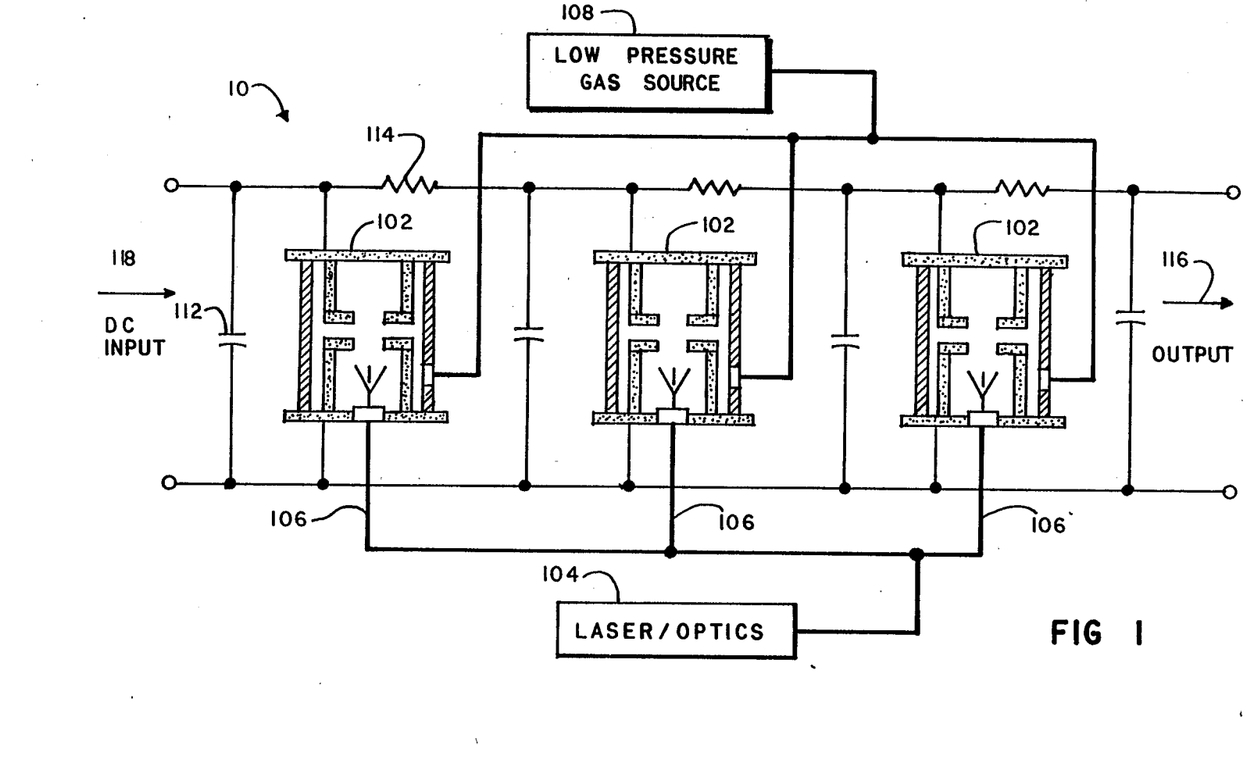
FIG. 1 is a schematic illustration of a high power switch network in accordance with the present invention.

A high power switch network 100 includes light-initiated glow discharge switches 102 in a Marx configuration, as shown in FIG. 1. A laser 104, including appropriate optics, is used for triggering the switches via fiber optic cables 106. A low pressure gas source 108 replenishes pressure losses due to repeated triggering of the switches via gas conduits 110.

As is well understood in the power electronics arts, the Marx network provides for parallel charging and series discharging of capacitors 112, as determined by resistors 114. When the switches are triggered, the series discharge provides a voltage pulse at output 116 formed by summing the voltage contribution of the capacitors, each of which can have attained a potential up to that provided by a power supply at input 118.

Figure 2:
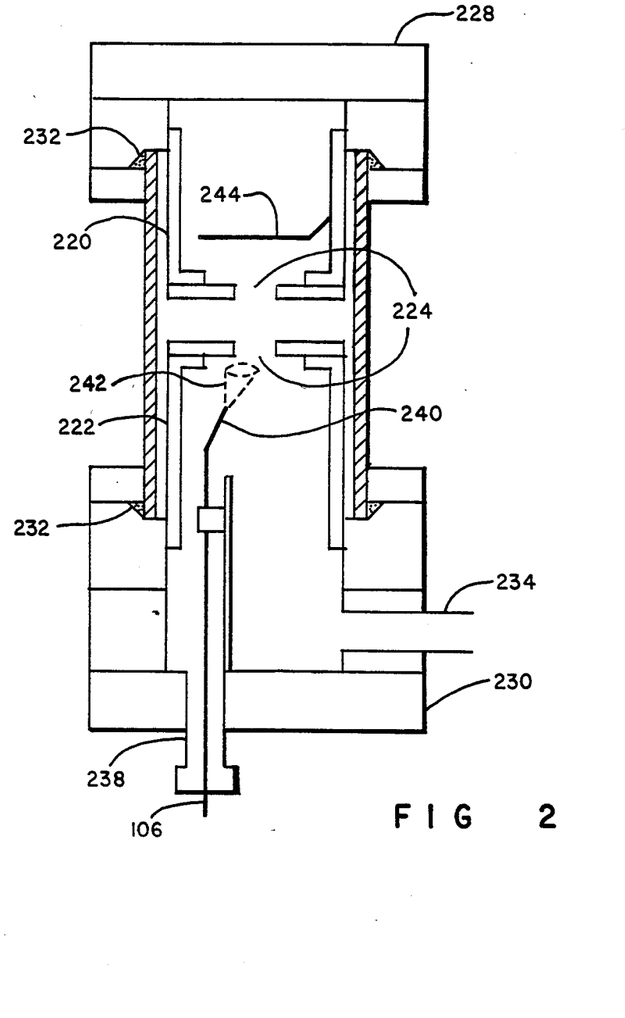
FIG. 2 is a sectional view of a switch used in the network of FIG. 1.
Figure 3:
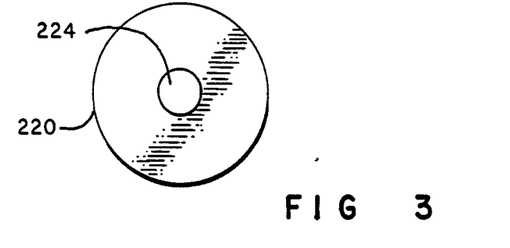
FIG. 3 is a top view of an electrode used in the switch of FIG. 2.

One of the three identical switches 102 is shown in FIG. 2. The illustrated switch 102 includes a cup-shaped anode 220, and a cup-shaped cathode 222. Each of these electrodes includes a central aperture 224, as indicated in FIG. 3 with respect to the anode 220. The electrodes are fitted within a glass tube 226. An anode end cap 228 and a cathode end cap 230 are sealed to the glass tube 226 with O-ring seals 232. A gas port 234, which connects to the gas conduits 110 of FIG. 1, is provided so that the low pressure gas source 108 can replenish ionized gas molecules absorbed by the electrodes.

One of the fiber optic cables 106 is fitted through a vacuum sealed port 238 so that light can be injected from the laser 104. The fiber optic cable 106 terminates in a rigid optical element 240 which serves to direct unfocused light toward the center of the cathode, as indicated at 242. This unfocused light is used to trigger a glow discharge which closes the switch 102. Because of the application of the light to the back of the cathode 222, switch 102 can be referred to as a back-lit thyratron (BLT).

An alternative switch provides for side injection of light. This switch includes a cup-shaped anode 420, a cup-shaped cathode, an anode end cap a cathode end cap a glass tube O-rings seals, and a gas port, similar to the switch 102. However, a fiber optic cable extends through a vacuum port formed through the side wall of the cathode cup.

The alternative is a stakable multistate fiber optic triggered BLT. This alternative switch employs vacuum/discharge materials such as alumina insulators and all molybdenum structures, a somewhat different electrode/cup geometry. The optical fiber cables are imbedded within the cathode itself so as to produce photo-electrons where they will be most effective. This type of switch can achieve high-voltage and high-current switching directly, without intermediate stages and transformers which degrade system rise times, consume considerable space and weight, and dissipate energy.

Referring again to FIG. 2, switch 102 is characterized by high voltage standoff, high peak current capability, fast current rise, low delay and jitter, and a simple easily constructed device geometry. The switch 10 is triggered by a UV light pulse guided by the fiber optic cable 106 to the aperture 224 in the cathode 222. Photo-electrons are produced and these quickly avalanche to initiate the discharge and close the switch 102. Operational results of this triggering method indicated that it is suitable for scaling switches to very high voltages and currents by simultaneously triggering multiple gaps in parallel or series.

BLT switches consist of two or more electrodes separated by insulators in a low pressure (0.2 Torr or less) gas such as $H_2$, He, $N_2$, or Ar. The electrodes are notable due to a hole (1–5 mm) in the center. These switches operate on the left side of the Paschen curve, and produce voltages of about 10 to 40 kV/gap with a gap spacing of 1 mm to 10 mm between electrodes. These switches are capable of handling high currents: the BLT has been operated at a peak current of 10 kA in a 2 $\mu$s pulse with a di/dt of $2 \cdot 10^{11}$.

There are several different triggering methods: surface discharges, DC/pulsed glow with a blocking potential, and intense UV light pulse incident upon the back of the cathode. The plasma discharge between electrodes is spatially confined to the electrode holes—producing a very intense arc-like plasma —whereas the plasma that extends into the cathode and anode structures is diffuse and akin to a glow-discharge. Because of this combination of arc-like and glow discharges, these switches are able to operate at the high-powers and high di/dt of a spark-gap but without the severe lifetime and repetition rate limitations.

Despite progress in developing these new switches, there exists a need for more appropriate triggers for these devices. The method of triggering is crucial because it determines delay and jitter, and it is often the limiting element in terms of lifetime and repetition rate. In addition, the current methods are often complex and cumbersome, and not suited for simultaneous triggering of multiple gaps due to electrical isolation or jitter problems.

Advantages of using an external light source for triggering include complete electrical isolation, serviceability of the trigger separate from the switch and ease of extending to triggering multiple gaps/switches simultaneously. A fiber optic waveguide is a simple and practical way to distribute the light and it can be designed so that the light is delivered exactly upon edge of the cathode hole--which leads to lower delay and jitter and reduce optical energies required for triggering. At a wavelength of 308 nm (XeCl excimer laser), good triggering was found with as little as 1.5 mJ of laser energy incident in a 10 ns pulse on the electrode.

In the optically triggered light initiated switch 102, FIG. 2, the electrodes are made of molybdenum, or alternatively nickel plate, and supported by an aluminum cup structure within the glass tube 226. The gap spacing is adjustable, usually from 2–5 mm, and the holes in the electrodes are typically about 5 mm. Behind the anode electrode is a baffle 244 to prevent fast electrons generated in the breakdown phase of the discharge from impinging on the aluminum structures and releasing impurities. The fiber cable 106 can be either a 1 mm diameter PCS (Plastic Coated Silica) good to approx 250 nm or an all silica fiber 1.5 nm good to 190 nm. The fiber cable 106 is sealed in a glass tube to form a vacuum feedthrough and is positioned relative to the cathode 222 by a small, unobtrusive molybdenum mount.

Typically, the light from the fiber cable 106 is directed immediately around the aperture 224 of the cathode 222; some light goes through to the anode 220 but this has no significant effect. The low pressure gas source 108 is able to deliver gas through the cathode side of the switch. This gas flow has two purposes: to remove impurities generated by the discharge, and to regulate the pressure. In an alternative embodiment, a pressure sensor is used to provide feedback. This further reduces pressure drift, and thus delay drift and jitter.

The laser 104 is an excimer laser operating with XeCl at 308 nm, which is in the ultraviolet (UV) range. Alternatively, a UV flashlamp can be used, and different wavelength ranges are provided for by the present invention. Up to 8 mJ of laser light can be coupled into the fiber cable 106. The charging voltage on the anode 220 can range from 5 to 25 kV (corresponding to a pulse energy of 6 to 150 Joules) and the current pulse, monitored by a high-bandwidth current transformer, ranged from 0.75 to 4 kA with a full width at half maximum (FWHM) of about 2 $\mu$s. The pressure in the switch 102 is set at 0.1 to 0.2 Torr of $H_2$ and operated at a repetition rate of 0.1 to 10 Hz. The 10 Hz limit is due to power supplies/load limitations and not to any switch considerations.

The jitter and delay times have been measured at 0.4 ns half-width half maximum (HWHM) and 78 ns, respectively, operating at a pressure of 210 mTorr of $H_2$, 10 kV anode charging voltage, 4.4 mJ, 308 nm light from the fiber, and molybdenum electrodes.

The number of photoelectrons generated by the UV light pulse from the fiber has been directly measured to be $5 \cdot 10^8$ to $2 \cdot 10^8$ photoelectrons for light pulse energies from 1.5 to 6 mJ at 308 nm. This corresponds to a quantum efficiency of about $10^{-7}$, which is consistent with the work function of the electrodes (about 4.25 eV for molybdenum and 5 eV for nickel) and is slightly greater than the energy per photon (4.025 eV at 308 nm). Greatly enhanced performance can be achieved with shorter wavelengths, e.g., around 200 nm, transmitted through fibers fabricated, for example, from KrCl.

Switch 102 can be triggered using an UV flashbulb rather than the excimer laser as the light source. This flashbulb generates an intense pulse with considerable about of the light in the range of interest (30% less than 300 nm). Because the power density of the light is not as high as the laser, several fibers forming a small bundle can be used to transmit the UV light pulse to the switch. In this case, an optimization of the flashbulb triggering discharge circuitry can result in good switch performance at very low costs.

Thus provided is a new and practical method of switching a low pressure, high-power BLT discharge switch. Using a fiber optic waveguide to deliver the UV light pulse to the cathode aperture and trigger the discharge has several advantages over other comparable methods and, in particular, it is noteworthy for the ease of extending this to simultaneous triggering of multiple switches/gaps in parallel or series. The switch 102 has demonstrated a low delay and jitter (78 and 0.4 ns, respectively), and has shown reasonable switch lifetimes ($> 10^5$ shots). In addition, good triggering is possible with as little as $5 \times 10^8$ photoelectrons.

Among the electronic switches used as a trigger or pulse generator in a laser system is the thyratron, a gas-filled triode tube having an anode, cathode, and control grid. The thyratron operates in either a quiescent state where no current is passed or in a firing state which allows the controlled discharge of high current through its ionized gas chamber.

On type of thyratron is the model HY3202 manufactured by EG & G, Inc., Electro-Optics Division, Salem, Mass. (for use in conjunction with the Lambda Physik Laser), which is a heated cathode design. Unlike conventional thyratrons which are triggered at their grid, the model HY3202 thyratron receives a trigger pulse at its cathode, which renders a groundedgrid positive with respect to the cathode. Electrons injected from the heated cathode, after triggering, travel through the grid space and into the region between a positive anode and the grounded grid. A low impedances spark arises between the anode and grid, allowing high current to flow in the tube while protecting the cathode from excess wear. (An improved version of the model HY3202 is manufactured by English Electric Valve, Ltd., of Chelford, Essex, England.) Thyratrons offer fast rise-time, low internal resistance, easy ignition by an external trigger and rapid recovery; but, they suffer from electrode wear.

The pseudospark, a high powered fast switch, is disclosed by D. Bloess, et al., in *Nuclear Instruments Methods* 205, 173 (1983). In this article, the authors describe a multigap "pseudospark" chamber for producing a controlled trigger mechanism for the fast switch. The thyratron and "pseudospark" chamber switches generally operate according to a law of electro-physics known as Pachen's law. Paschen's law defines the ability of gases to hold off a large voltage before breakdown and current flow as a function of the product gas pressure and the spacing between electrodes.

Figure 10:
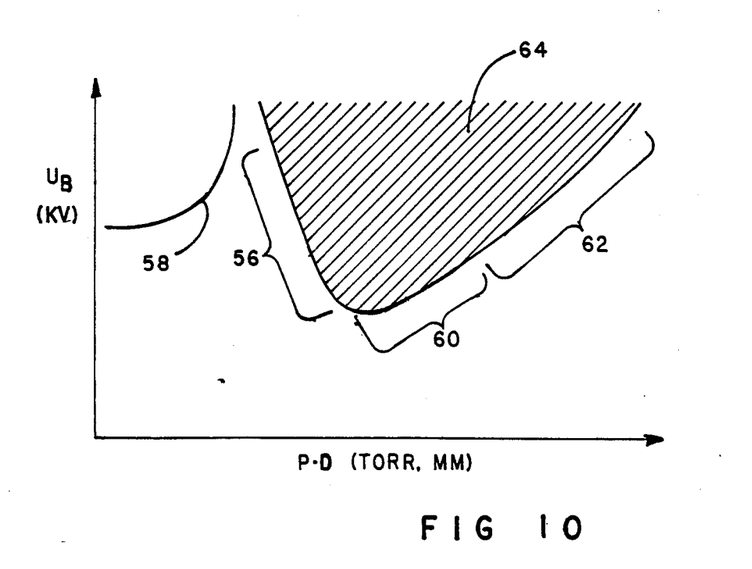
FIG. 10 shows a plot of the Paschen curve showing the region of gas pressure in which the switches of FIGS. 2, 4 and 5 operate.

FIG. 10 is an example of an experimental plot illustrating Paschen's law. The graph of FIG. 10 has its horizontal axis representing the product of pressure times distance between anode and cathode or cathode and grid, and its vertical axis representing breakdown voltage. The resulting plot is a U-shaped curve ranging above vacuum conditions. At values above 25 to 40 mbar·nm, a near linear rise appears. In this region, high pressure tubes having electrodes positioned a fixed distance apart show greater control the greater the separation of the electrodes. This region is known as the right side (62) of the Paschen curve.)

The Paschen curve of FIG. 10 bottoms out at about 7-13 mbar·mm, or about 7-13 Torr. 760 Torr equals about one atmosphere of pressure. At pressures below this minimum and down to about $10^{-3}$ Torr, the left side (56) of the Paschen curve exhibits a sharp rise in the curve below. On this left side of the Paschen curve, by precisely and sharply lowering internal gas pressure within a gas filled tube, control of triggering can be attained in the high voltage range.

Grid-controlled thyratrons and the triggered pseudospark chamber described by Bloess operate on the left side of the Paschen curve in the lower distance-pressure regions. These switches, however, due to the need for a physical grid, have higher impedance; and, the grid and cathode, even in cold cathode switches, experience degradation and limited life. Also, in switches triggered using a physical grid interposed between the anode and cathode, the electrode trigger is electrically coupled to the controlled high-power circuit. This electrical coupling of the controlled main circuit to the trigger introduces inherent safety problems.

To avoid the safety problems of a grid which is coupled to the controlled anode-to-cathode circuit, a laser triggered spark gap was proposed in the November, 1965 issue of the *Review of Scientific Instruments,* Volume 36, at page 1546, authored by A. H. Guenther, et al.

The spark gap switch proposed by Guenther et al. comprises a high pressure gas-filled chamber having stainless steel elect rodes 5 cm in diameter and spaced 1.5 cm apart. A focused laser beam is directed by an 50 nm lens at a focal point midway between the two electrodes along a line joining their respective centers. Controlled voltage breakdown and flow of current between the electrodes is initiated by the focused laser beam. Gas pressure in the chamber of this spark gas switch is held at about 600 Torr (or nearly one atmosphere gas pressure.) The laser focal point is moved over a ranged between 0.335 cm and 0.0 cm from the cathode. Focusing the laser beam on the surface of the cathode electrode initiated arc formation by thermionic emission of electrons from the cathode surface, as well as blow off of gaseous products from a surface irradiated by a *focused* laser. These ejected gases may be composed of electrode material and absorbed gaseous dielectric. Guenther reported that the largest triggerable region, outside the self-breakdown region (64) of the Paschen curve, occurs when the focused Laser beam is directed onto the surface of the cathode.

Figure 4:
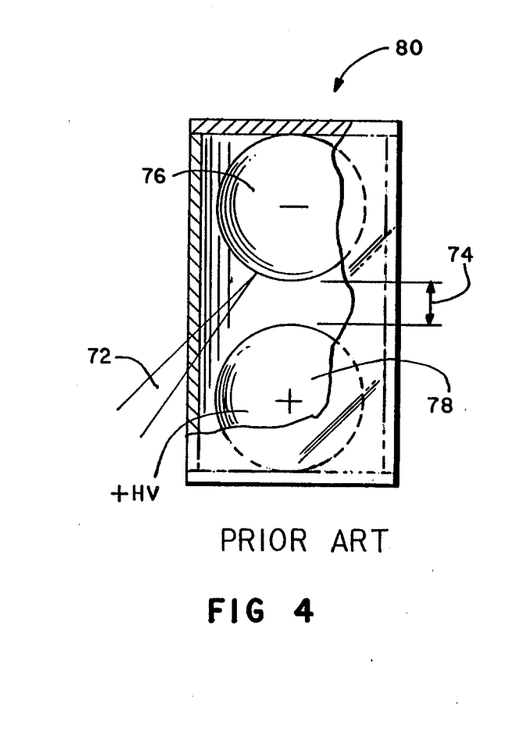
FIG. 4 is a cross-sectional view of a prior art laser triggered spark gap.

A laser triggered spark gap of the prior art is shown in FIG. 4. A focused laser beam 72 is directed at the surface of the cathode 76. It will be noted that cathode 76 and anode 78 are separated by a wide gap between the electrodes in the region of 1.5 cm. The cathode and anode of the Guenther apparatus are preferably spherical and are placed in a high-pressured gas-filled container 80. Triggering of this switch is initiated when the high powered laser beam 72, focused on the surface of the cathode 76, creates a plasma from the cathode material which lifts into the gas filled chamber and ionizes the gas between the electrodes causing a spark gap across the electrodes to form.

Guenther concluded that a laser triggered high-pressure spark gap switch has low jitter, short response time, and good switching technique, due to the electrical isolation of the optically coupled focused laser beam trigger. He also concludes and teaches that high-pressure triggering is easier and safer than lower pressure triggering.

Thus the state of the art clearly indicates that laser triggered spark gap switches operate at high pressures with a relatively wide gap between adjacent spherical electrodes. The use of a high power focused laser beam to trigger the switch (on the right side of the Paschen curve) results in the Laser or subsequent streamer arcing producing permanent cathode damage. At the other end of the Paschen curve, the left side, thyratrons and "pseudospark" switches operate but are triggered by electrically coupled grids providing impedance and delay in rise time, as well and control grid and anode degradation.

The BLT provides a high power electronic switch which draws from the advantages grid controlled thyratrons, as well as laser triggered spark gap with as good or better statistical parameters during operation of the switch. The BLT switch has good operating characteristics over a longer Life. The BLT switch provides improved stand-off voltage, peak current, current rate of rise, lifetime and low jitter repetition rates.

Heretofore, it has not been possible with a high current switch to initiate discharge through photoemission, as it has not been possible to fabricate devices that have photosensitive cathodes capable of operation in a low pressure region of the Paschen curve. The effect of the light or unfocused laser beam shining on the back of the cathode does not produce permanent cathode damage.

Experimentation has confirmed that the least degradation occurs within the area where the laser is incident on the cathode, for some configurations of the invention. This is the opposite from the situation of the laser triggered spark gaps. The back of the cathode light activated electronic switch disclosed herein is reliably triggered by Light without electrode degradation by the laser, and yet operates at a high stand-off voltage and high peak current.

With reference to FIGS. 5, 6, 7 and 9, there is shown the related light-initiated high powered electronic switch 10. The switch is generally cylindrical in shape and has a hermetically sealed envelope 16, made from a dielectric or insulator material which defines the cylindrical portion of the switch.

The envelope 16 may be also made from glass so that viewing of the operation of the switch may be accomplished where desirable. In actual operation, however, the envelope 16 need not be optically transparent, but preferably a good insulating material having a high dielectric constant, such as a ceramic or glass. The envelope has a conductive upper end cap 18 and a conductive lower end cap 20, and the holes are covered, respectively, by windows 52 and 22.

Window 52 is not required operationally and has been used for viewing the switch during performance testing. Window 22, replaced by fiber optic cables in switched 102 is a light source window and in the preferred embodiment may be made from quartz having an infrared to ultra violet bandpass capable of allowing optimum transmission of electromagnetic radiation of a wavelength of 308 nanometers.

Figure 7:
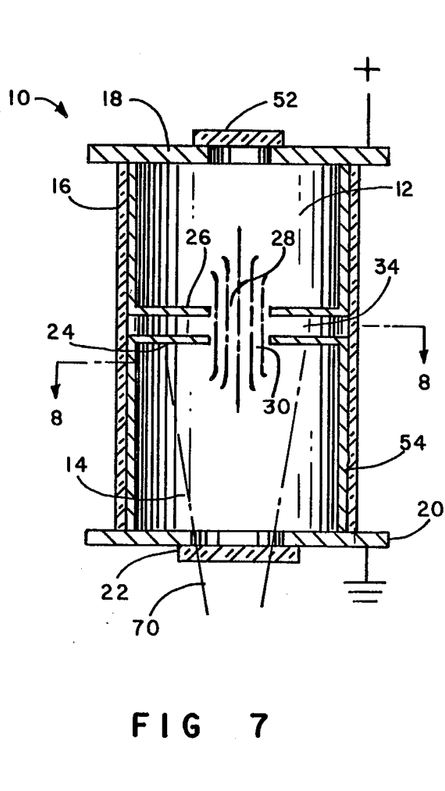
FIG. 7 shows a longitudinal axially directed cross-sectional view of the switch of FIG. 5 taken along lines 7—7 of FIG. 6.
Figure 9:
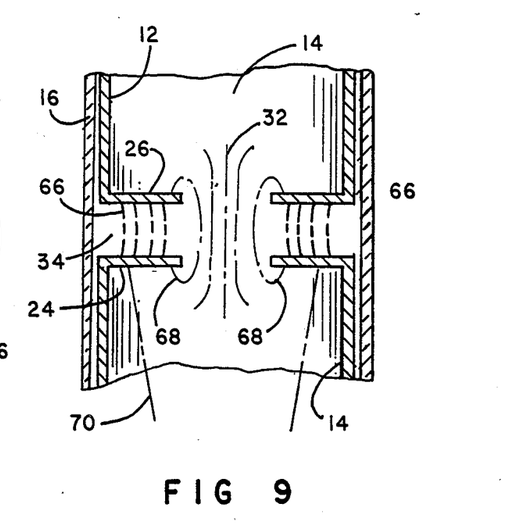
FIG. 9 shows an enlarged cross-sectional view of the switch of FIG. 5 revealing the standoff voltage field lines and the operative pathways through which current is discharged.

Within the hermetically sealed chamber defined by the envelope 16 is an anode cup 12 and a cathode cup 14. The anode and cathode cups in the preferred embodiment may be made from nickel or molybdenum. Copper also has been used to form the cylindrical walls of the anode 12 and cathode 14 cups. A bottom plate 26 is formed at the bottom of the anode cylinder and defines a central aperture 28 which in the preferred embodiment has a diameter of approximately 3 mm. A top plate 24 is positioned at one end of the cathode cup 14 and is juxtaposed opposite the anode bottom plate 26. Like the anode plate 26, the cathode top plate 24 defines a central aperture 30 which is positioned coaxially with the aperture 28 of the anode. Both the anode and cathode apertures 28 and 30 are of substantially equal diameter. The plates 24 and 26 are separated by a gap 34 which is substantially 3 mm, the same distance separation as the diameter of the central apertures 28 and 30. During operational conditions, current discharge 32 flows through the apertures as shown in FIGS. 7 and 9.

The chamber defined by the envelope 16 is filled by a gas such as helium, nitrogen, or hydrogen or other gases. These gases are allowed to enter the chamber defined by the envelope 16 so that a pressure of 0.1 to 0.5 Torr is maintained.

No heater mechanism is provided for the cathode cup 14. The electronic switch of this invention operates using a cold cathode. Up to 35 kV of stand-off voltage has been achieved. During operation, peak current has been measured as high as 10 kA. The current rise rate time defined as di/dt has been measured at $4 \times 10^{11}$ Amps/sec.

Figure 8:
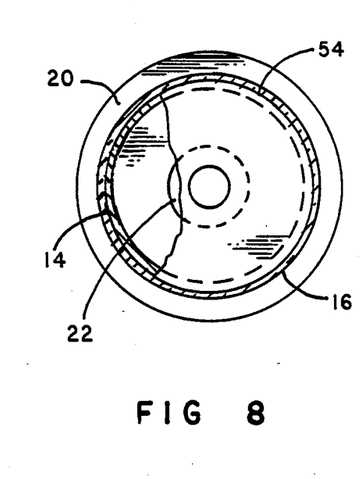
FIG. 8 shows a cross-sectional view of the switch FIG. 5 taken along lines 8—8 of FIG. 7.

The electronic switch operates on the Left hand side of the hydrogen and helium Paschen curves for electrode materials. It will be noted especially with references to FIGS. 7 and 8, that a 1 mm gap is maintained between the wall of the anode and cathode cups and the insulative envelop 16 so as to prevent flashing or shorting out of the switch during activation.

Figure 5:
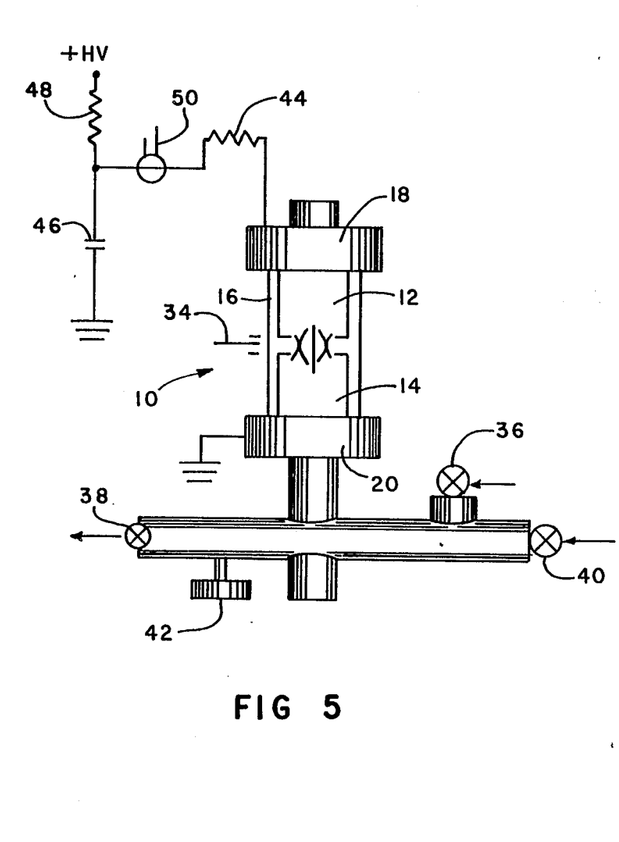
FIG. 5 shows an electronic switch which shares operating principles with the switches of FIG. 2 and FIG. 4.
Figure 6:
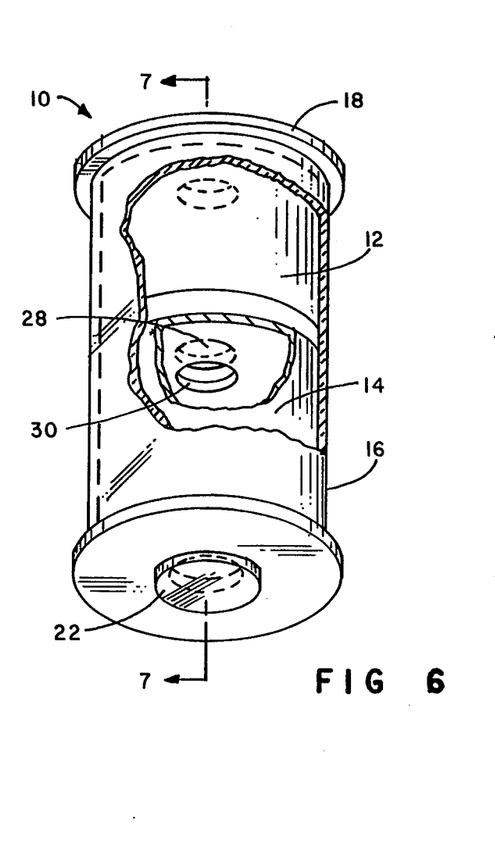
FIG. 6 is a perspective, partially sectional view, of the switch of FIG. 5.

Referring now to FIG. 5, an electronic system is shown in which the electronic switch 10 of this invention may operate. The envelope 16 defined within the electronic switch 10 is evacuated by sequential operation of first, the roughing pump 38, and then, the ion pump 40. Once substantially evacuated, helium or hydrogen gas is delivered through the inlet valve 36 and allowed to enter the chamber defined by the insulating envelope 16.

A capacitance manometer 42 displays the internal pressure of the electronic switch so that an operator can monitor the pressure and make sure that it remains within the range of 0.1 to 0.5 Torr. As noted with reference to FIGS. 5 and 7, the cathode cup 14 is grounded through the end plate 20. The anode cup 12 is operatively associated though a network with a high voltage source (+HV); and, this capacitor 46 may be replaced by a pulse forming network. When the capacitor 46 is fully charged, the resistor 48 assists in preventing any significant leakage before the closing of the switch. This RC network of resistor 48 and capacitor 46 are tied in series to a Low resistance load 44, which experimentally is a copper sulfate solution at a 3Ω rating, but which may be any load, such as the flash lamp of a laser. These elements may be replaced, alternatively, by a charging power supply.

The output waveforms produced when the circuit is operating are monitored by a visually perceivable meter 50 which is tied to a transient digitizer (not shown). When the switch is initially set at an open position, the anode 12 has a stand-off voltage approximately equivalent to the high voltage source (+HV) which in the preferred embodiment may be as high as 35 kV.

When unfocused light 70 (FIG. 7) is directed towards the aperture 28 and 30 upon the back side of the cathode top plate 24, a photo-emissive mechanism takes place wherein the unfocused light 70 initiates and triggers the freeing of electronics form the surface of the back of the cathode. These electrons then interact with gas molecules passing though the central aperture and throughout the hermetically sealed chamber defined by the envelope 16.

As the electronics which are knocked from the surface of the back of the cathode plate 24 interact with the molecules of the gas contained within the envelope 16, a chain reaction takes place which results in an avalanche of ionization, and an eventual controlled discharge of the switch across the gap 34 between the plates 26 and 24 through the central apertures 28 and 30.

A glow discharge of current may be observed 32 when the switch has been triggered by the unfocused light. The unfocused light initiates the discharge of current across the plates through photo-emission of electrons from the back of the cathode, rather than through the formation of a plasma at the surface of the cathode.

This mechanism of photo-emission is not ordinarily possible with a current switch. It has not been possible heretofore to fabricate devices that have photosensitive cathodes and also have cathodes in a region where neither the laser trigger nor arcing can produce permanent cathode damage. It has been experimentally observed that the least degradation of BLT switches occurs within the area where the laser is incident on the cathode. This is opposite the situation for laser triggered spark gaps.

Once the switch 10 is closed, current is allowed to flow through the switch and the capacitor 46 is allowed to discharge through the switch to ground by way of the end plate 20 (See FIG. 5). Once fully discharged, the capacitor again recharges by means of the high voltage source (+HV). During capacitor recharge, the anode cup 12, through end plate 18, is brought back to a high voltage stand-off and the switch 10 is thereby reopened, wherein the switching cycle may be repeated as often as the laser is able to flash. During experimentation, the rate of triggering of the switch has been laser limited at a repetition rate of 100 hertz. Faster switching laser triggers will in turn initiate faster switching repetition frequencies.

With reference to FIG. 9, a close up view of the anode cup 12 and cathode cup 14 and their respective plates 26 and 24 separated by the gap S4 is shown. A discharge glow 32 is shown to pass through the central apertures of the respective plates 26 and 24. Field lines 66 illustrate the electrical field between the anode plate 26 and the cathode plate 24 immediately prior to full discharge. It will be noted that central aperture field line 68 defines a longer pathway through which the primary discharge of current flow occurs. Current densities as high as 20 kiloamps per square centimeter have been achieved during current flow.

FIG. 10 shows a plot of the Paschen curve and the operating characteristics of BLT switch 10. Switch 10 operates on the left side of the Paschen curve 56 between the regions of vacuum operation 58 and the glow discharge region 60 of minimal breakdown. The Guenther article described laser triggered spark gap, shown in FIG. 4, operates on the right hand side of the Pachen curve in the region 62.

Area 64 defines the region wherein the electrodes are unable to hold off self-initiated discharge of current across separated electrodes. It is necessary for any gas-filled electronic switch to initially operate outside the confines of the region 64 in order to obtain a controllable trigger. Like thyratrons and a pseudospark device hereinbefore described, the BLT switches 10, and 102 operate in the region 56 on the left side of the Paschen curve. Thus, these BLT switches operate in such a manner that the lower the pressure at a fixed distance, the more voltage one is able to stand off.

The BLT switch 10 operates in an entirely different manner than that of the Laser triggered spark gap (shown in FIG. 11) which operates on the right side of the Paschen curve. The laser triggered spark gap requires increasing higher pressures at a greater fixed distance between the electrodes to achieve high stand-off voltage.

The operation of the Guenther prior art device of FIG. 4 is shown in stark contrast to the applicant's design. The cathode 76 of the Guenther device necessarily degrades with time due to the wearing down of its surface by the focused laser beam 72. Applicant avoids this cathode degradation by presenting an *unfocused* light beam 70, FIG. 9, on the back of the cathode surface.

While a preferred embodiment of the invention has been described in detail, it must be kept in mind that alternative equivalent and modified configurations of the switch network can also be made according to the teaching of this invention. For example, experimentation has indicated that a graded grid construction may be plausible wherein in addition to the two cups disclosed herein, a plurality of smaller diameter cups may be telescoped within both the anode and cathode, providing an increasingly differing potential cup to cup such that the smallest of the telescoped cathode cups is the most negative and the plurality of layers of cups become continually positive until the smallest anode cup is reached. In this manner of layering of cup construction, one may achieve even greater stand-off voltage than has been achieved with the single anode and cathode cups described in this invention. Other modifications and variations are provided by the present invention, the scope of which is limited only by the following claims.

What is claimed is:

1. A switch network comprising:
   output means for providing an output;
   power supply means for providing power;
   pulse-forming network means for storing power supplied by said power supply means, said pulse-forming means being electrically coupled to said power supply means;
   plural light-initiated glow discharge switches electrically coupled to each other, to said pulse forming means and to said output means; and
   a light source optically coupled to said switches so that when said light source is activated said switches close to transfer power from said pulse-forming network means to said output means.

2. The switch network of claim 1 further comprising fiber optic cables for optically coupling said light source to said switches.

3. The switch network of claim 1 further comprising gas source means for supplying gas to replenish gas within said switches as it is depleted.

4. The switch network of claim 1 wherein each of said switches include:
   a cylindrical anode cup having a bottom plate having a first aperture;
   a cylindrical cathode cup having a top plate having a second aperture;
   said anode and cathode cups being juxtaposed anode bottom plate to cathode top plate, and being separated by a small gap wherein said first and second apertures are in substantial alignment;
   envelope means for hermetically sealing said anode and cathode cups; and
   ionizable material within said envelope;
   said light source directing unfocused light toward said apertures, said unfocused light having a sufficiently short wavelength to trigger the flow and discharge of high amperage current across the gap between said top and bottom plates.

5. The switch network of claim 4 wherein said light source includes a UV laser.

6. The switch network of claim 4 wherein said each said switch when triggered operates in the pseudospark range of the Paschen curve.

7. The switch network of claim 4 wherein the envelope of each of said switches is filled with gas at a pressure within the range of 0.1–0.5 Torr.

8. The switch network of claim 4 wherein photoemission of electrons from the back of the cathode cup, caused by a directed unfocused laser beam, results in the discharge of high amperage current across the gap between said top and bottom plates.

9. The switch network of claim 1 wherein said light source is electrically isolated from said switches and said pulse-forming network means.

10. The switch network of claim 3 wherein said gas source means includes controllable operable gas valves and a capacitive manometer for monitoring the pressure levels contained within the vessels into which gas is allowed to flow.

11. The switch network of claim 1 wherein said switches are thermally and electrically isolated from said light source, each of said switches including:
    an elongated, hermetically-sealed, high dielectric constant material envelope, said envelope being filled with ionizable gaseous material at a relatively low pressure; and
    a pair of metallic, conductive cups, positioned bottom to bottom, each of said cups being cylindrical with flat bottom plates, said plates defining a pair of apertures, said cups being mounted substantially coaxially within said envelope and separated by a small gap, the distance of which is comparable to the diameter of said central apertures.

12. The gas-filled electronic switch of claim 11, wherein said light source includes a laser producing electromagnetic radiation of a wavelength of 308 nm or less.

13. The gas-filled electronic switch of claim 11 wherein said gas filling within said envelope is helium at a pressure of 0.1–0.5 pk Torr, so that said switch operates during voltage standoff at the left side of the Paschen curve.

* * * * *